United States Patent
Ide et al.

(10) Patent No.: US 7,838,185 B2
(45) Date of Patent: Nov. 23, 2010

(54) FOCUS MEASUREMENT METHOD AND METHOD OF MANUFACTURING A SEMICONDUCTOR DEVICE

(75) Inventors: Rimiko Ide, Aichi (JP); Kenji Noda, Osaka (JP); Hirofumi Fukumoto, Toyama (JP); Kenichi Asahi, Toyama (JP); Naohiko Ujimaru, Hyogo (JP)

(73) Assignee: Panasonic Corporation, Osaka (JP)

( * ) Notice: Subject to any disclaimer, the term of this patent is extended or adjusted under 35 U.S.C. 154(b) by 155 days.

(21) Appl. No.: 12/358,656

(22) Filed: Jan. 23, 2009

(65) Prior Publication Data

US 2009/0197189 A1      Aug. 6, 2009

(30) Foreign Application Priority Data

Feb. 1, 2008     (JP) .............................. 2008-022948

(51) Int. Cl.
*G03F 9/00* (2006.01)
*G03C 5/00* (2006.01)

(52) U.S. Cl. .................. 430/30; 430/296; 430/942; 382/145; 382/149

(58) Field of Classification Search ................ 430/30, 430/296, 942; 382/145, 149
See application file for complete search history.

(56) References Cited

U.S. PATENT DOCUMENTS

| 6,295,629 | B1 | 9/2001 | Suganaga | |
|---|---|---|---|---|
| 6,979,820 | B2 * | 12/2005 | Ke et al. | 250/307 |
| 7,285,781 | B2 * | 10/2007 | Cao et al. | 250/311 |
| 7,474,382 | B2 | 1/2009 | Fukumoto et al. | |
| 7,541,120 | B2 * | 6/2009 | Terahara | 430/22 |
| 2005/0221207 | A1 | 10/2005 | Nagatomo et al. | |
| 2006/0285098 | A1 | 12/2006 | Fukumoto et al. | |

FOREIGN PATENT DOCUMENTS

JP      2005-012158     1/2005

* cited by examiner

*Primary Examiner*—Christopher G Young
(74) *Attorney, Agent, or Firm*—McDermott Will & Emery LLP

(57) ABSTRACT

In a focus measurement method and a method of manufacturing a semiconductor device relating to the present invention, a focus value is obtained by using a fluctuation where shrinkage of a resist pattern by an electron beam irradiation depends upon the focus value. In the case of obtaining the focus value, the shrinkage of the resist pattern for a focus measurement formed by exposure to be subject for a focus value measurement is measured. The focus value corresponding to the shrinkage is obtained from the pre-obtained focal dependency of the shrinkage. A focal shift length can be defined from a difference between the focus value and a predetermined best focus value.

17 Claims, 11 Drawing Sheets

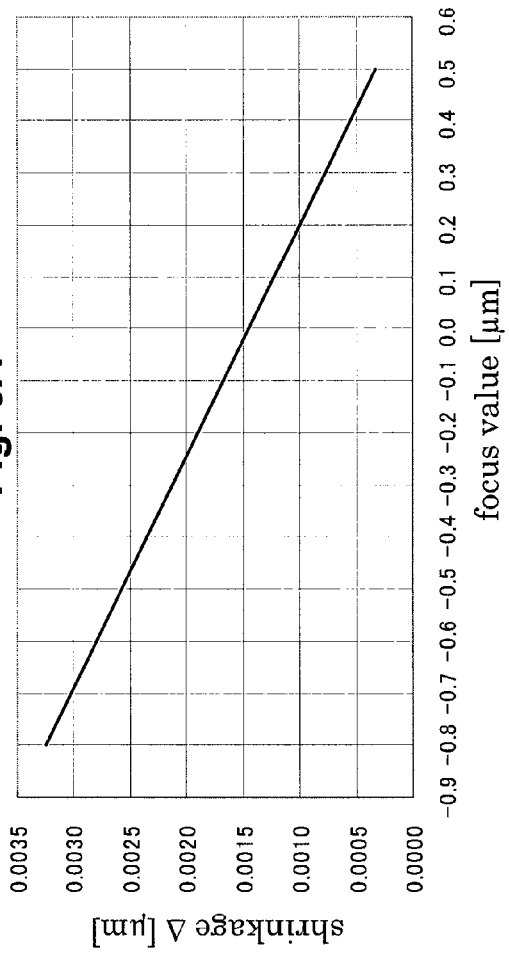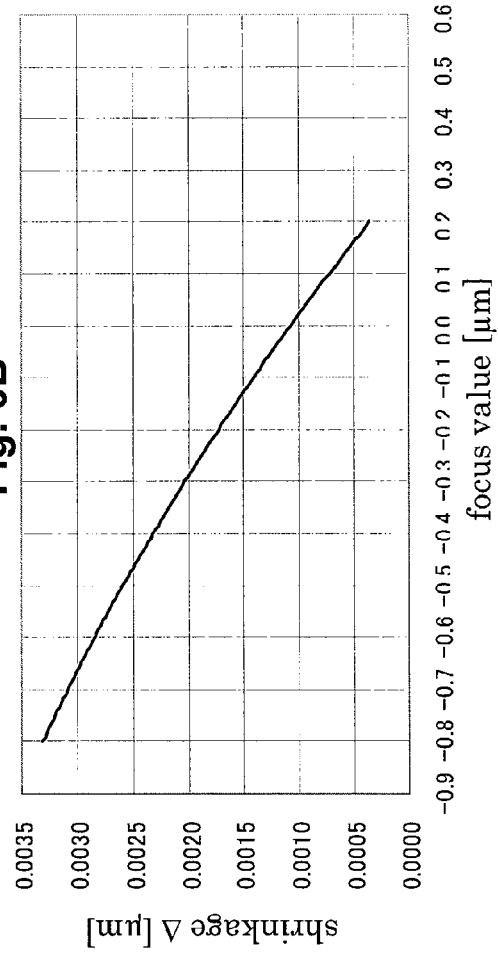
Fig. 6A
Fig. 6B

FOCUS MEASUREMENT METHOD AND METHOD OF MANUFACTURING A SEMICONDUCTOR DEVICE

CROSS-REFERENCE TO RELATED APPLICATION

The present application claims the benefit of Japanese Patent Application No. 2008-022948 filed Feb. 1, 2008, the subject matter of which is incorporated herein by reference.

BACKGROUND OF THE INVENTION

1. Field of the Invention

The present invention mainly relates to a method of measuring and adjusting exposure focus in a lithography process, and a method of manufacturing a semiconductor device using said method.

2. Description of the Related Art

Conventionally, an exposure apparatus (such as, a stepper and the like) is used for forming a fine element pattern of a semiconductor integrated circuit. The exposure apparatus performs projection exposure to form an image of a mask pattern on a reticle to a resist film having photosensitivity formed on a semiconductor substrate. The projected mask pattern is patternized as a pattern of the resist film by developing the exposed resist film. It is necessary to project the mask pattern on the reticle to a photoresist film without being out of focus on the resist film in order to obtain a resist pattern having designed predetermined cross sectional shape and dimension. As a technique to confirm a presence of focal shift state in a photolithography process of a semiconductor integrated circuit, a focal shift measurement method is described in Japan Patent Application Laid-Open No. 2005-012158.

Hereafter, outlines of the focal shift measurement method and a determination method for a best focus described in the prior document will be explained. In this technique, an isolated line pattern and an isolated space pattern are formed in a resist film, and a focal shift length is detected using a focal dependency of these pattern dimensions. FIG. 9 is a cross sectional view showing the isolated line pattern and isolated space pattern. In such technique, a top dimension 201 of an isolated line pattern 200, a bottom dimension 202 of the isolated line pattern 200, a top dimension 203 of an isolated space pattern 210 and a bottom dimension 204 of the isolated space pattern 210 are measured. The dimension to be measured in the isolated line pattern 200 is a line width, and the dimension to be measured in the isolated space pattern 210 is a space width.

FIGS. 10A and 10B are graphs showing focal dependency of the dimensions 201 to 204. FIG. 10A shows the focal dependency of the isolated line pattern 200, and FIG. 10B shows the focal dependency of the isolated space pattern 210. The horizontal axis of FIG. 10A indicates a focus value, and the vertical axis indicates a normalized edge inclination amount $\Delta Ln$ of the isolated line pattern 200. The normalized edge inclination amount $\Delta Ln$ is a difference between an edge inclination amount $\Delta L$, which is a value obtained by subtracting the bottom dimension 202 from the top dimension 201 and an edge inclination amount $\Delta Lo$ at the time of best focus, $\Delta Ln=\Delta L-\Delta Lo$. Further, the horizontal axis of FIG. 10B indicates a focus value, and the vertical axis indicates a normalized edge inclination amount $\Delta Sn$ of the isolated space pattern 210. The normalized edge inclination amount $\Delta Sn$ is a difference between an edge inclination amount $\Delta S$, which is a value obtained by subtracting the bottom dimension 204 from the top dimension 203 and an edge inclination amount $\Delta S_o$ at the time of best focus, $\Delta Sn=\Delta S-\Delta So$. In the graphs shown in FIGS. 10A and 10B, a focus value whose value in the vertical axis becomes zero can be regarded as best focus values for the patterns 200 and 210, respectively.

FIG. 11 is a graph showing focal dependency of tie sum of the normalized edge inclination amounts $\Delta Ln$ and $\Delta Sn$ (hereafter, referred to as a shift index) shown in FIGS. 10A and 10B. Herein, the horizontal axis of FIG. 11 indicates a focus value, and the vertical axis indicates the shift index. As shown in FIG. 11, the shift index normally indicates a change with a constant tilt with regard to the focus value. In the relationship shown in FIG. 11, a focus value whose shift index becomes zero can be regarded as a best focus value that satisfies both the isolated line pattern 200 and the isolated space pattern 210.

Therefore, in an exposure process for a semiconductor device, before exposing a pattern to a semiconductor substrate, at first, the top dimensions 201 and 203 and the bottom dimensions 202 and 204 of the isolated line pattern 200 and the isolated space pattern 210 are measured, respectively, and the results are calculated and the focal dependency of the shift index shown in FIG. 11 is acquired beforehand. Then, the top dimensions 201 and 203 and the bottom dimensions 202 and 204 of the isolated line pattern 200 and the isolated space pattern 210 formed on an occasion of the actual pattern exposure are measured and the shift index are calculated, and the result are compared with this graph. With this step, how much the actual focus value is shifted from the best focus value can be easily calculated. This method can easily and accurately detect a presence of a focal shift and a focal shift length and this is very useful as a focus measurement method.

SUMMARY OF THE INVENTION

However, in recent years, dimensions of semiconductor integrated circuit element patterns have continued to be miniaturized, and the minimum dimension has reached 65 nm or less. In order to form a semiconductor element having such miniaturized dimension, excimer lithography, for example, using an ArF laser (wavelength: 193 nm) with a short wavelength is used. Unlike conventional resist materials, such as i-line based upon novolak resin, a chemically-amplified resist in response to the excimer lithography shrinks due to its chemical characteristic when the resist is exposed to an electron beam for measuring the resist dimensions. The shrinkage by the electron beam irradiation occurs with the conventionally-used resist, as well, and the shrinkage of the resist for ArF particularly becomes greater because of its chemical characteristic by having an acrylic polymer. It appears that the shrinkage by the electron beam occurs due to an evaporation of residual solvent in the resist and cleavages of polymer bonds by the electron beam irradiation. If an error occurs to a value of the measured length due to this shrinkage, the accuracy of the focus measurement shall worsen by the shrink.

Further, since the resist pattern width itself is small in the manufacturing process generation using the ArF laser lithography, the shrinkage becomes a relatively unignorable size with regard to the dimension of the resist pattern. For example, when the same point in an ArF line pattern with approximately 100 nm of width is measured 10 times, 1.9 nm of variation occurs among the measured values from the 1st time to the 10th time due to the shrinkage by the electron beam irradiation at the time of the measurement.

In addition, because the shrinkage occurs due to the electron beam irradiation, the pattern shrinks at the same time of the length measurement, and an error shall occur to a value of the measured length. When the same point is measured 10 times as described above, not only between the 1st time and the 10th time, the shrinkage has already occurred between the 0th time (before the measurement) and the 1st time. In the above-mentioned example, 1 nm of the shrinkage has occurred between the 0th time and the 1st time, and as a result, the shrinkage with the ten times of measurement is 2.9 nm in total. Consequently, in the actual measurement of the length of ArF resist, it is necessary to calculate a value of measured length before shrinking by a length measuring apparatus using a shrinkage curve prepared beforehand. The length measuring apparatus determines a shrinkage curve indicating a relationship between the shrinkage of the resist pattern and the number of scanning times of the electron beam for length measurement beforehand, and when the length of a normal pattern is measured, actually-measured values are plotted on the shrinkage curve and calculates the dimensions at a point where the number of electron beam scanning times is zero indicated with the curve.

However, in a fine process with the minimum dimension: 250 nm or less using a chemically-amplified high sensitive resist, particularly in a process requiring fine dimension processing with less than 100 nm, such as 65 nm or 45 nm, there is a concern that the focus measurement becomes more and more difficult due to the shrinkage of the resist film, and the focus measurement suitable for such process is expected.

The objective of the present invention is to provide a method of enabling accurate and easy focus measurement even in a fine resist pattern whose shrinkage is relatively greater, and a semiconductor manufacturing method using the focus measurement method.

In order to accomplish the objective, in the present invention, a resist pattern formed by an exposure is repeatedly measured n-times. A dimension value in the 1st measurement is subtracted from the dimension value in the n-th measurement against the same resist pattern, and a shrinkage of the resist pattern occurred due to the repetitive measurements can be obtained from the difference. Shrinkage data is obtained for each focus fluctuation, and a model data of a focal dependency is prepared beforehand. A measurement for obtaining the shrinkage is conducted with a pattern type and a pattern width measured at the time of preparing the model data and the result is compared to the model data, and then, where the shrinkage is located among the focus values can be calculated back.

Thus, the repetitive measurement of the same resist pattern results in reference of the focal dependency result according to a magnitude of the shrinkage fluctuation, and the shift from the best focus value is calculated. In addition, it is possible to form a difference from the best focus value according to the obtained focus value as mentioned above, and a focus correction amount in the exposure of focus measurement subject can also be obtained.

According to the present invention, even in the fine pattern whose shrinkage becomes relatively great, an accurate focus value and focal shift length can be obtained with lesser data. Then, the focus adjustment per exposure or per unit of exposure (lot) according to the focal shift length enables the inhibition of increase in the focal shift and the formation of a resist pattern with high accuracy. As a result, a semiconductor device can be formed with high production yield.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A and 6B are graphs showing the focal dependency of the shrinkage in each exposure apparatus in one embodiment relating to the present invention.

DETAILED DESCRIPTION OF PREFERRED EMBODIMENTS

First Embodiment

Hereafter, a first embodiment relating to the present invention will be explained. In the present invention, noticing that a shrinkage by an electron beam is great with a chemically-amplified resist, the shrinkage is digitalized according to the measurement of a resist pattern dimension, and a focus of the exposure apparatus is calculated using the digitalized shrinkage. For the digitalization of the shrinkage, shrinkage of the resist pattern by the electron beam with a CD-SEM (critical dimension-secondary electron microscopy) is utilized. In this embodiment, a dimension measurement point of the resist pattern is fixed and the dimension is repeatedly measured n-times, and the shrinkage occurred by the electron beam irradiation during the measurements is calculated by subtracting the pattern dimension in the n-th measurement from that in the 1st measurement.

<Measurement and Calculation of Resist Pattern Shrinkage>

Figure 1B:
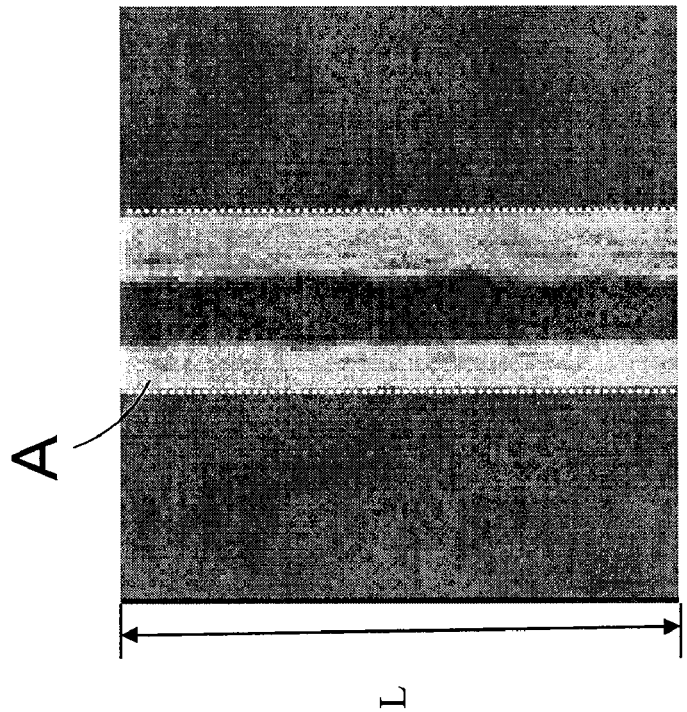
FIGS. 1A and 1B show SEM pictures showing a measurement pattern of shrinkage in one embodiment relating to the present invention, respectively.
Figure 1A:
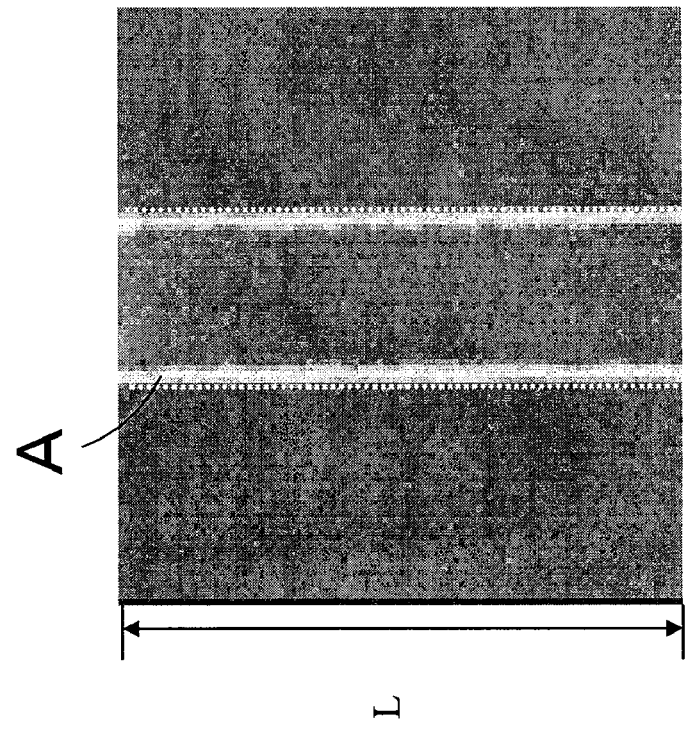

FIGS. 1A and 1B are SEM image pictures showing a fine resist pattern observed from the upper side with the CD-SEM. This example aims at an isolation pattern of KrF resist (exposure wavelength: 248 nm) formed on a semiconductor substrate. The line pattern width is 0.15 μm, and the line pattern is 1 μm or more away from an adjacent pattern.

When a resist pattern is prepared by an exposure apparatus, a numerical aperture NA and a wavelength of the exposure apparatus become main parameters for defining the minimum dimension of the resist pattern. In the exposure apparatus, diffraction occurs due to a scattered light via passing through a reticle for the resist pattern. The resist pattern is formed by using the diffraction, and the finer the resist pattern to be prepared becomes, the more difficult it becomes to cause interference of a primary light due to the diffraction. Compared to a line/space pattern with a smaller arrangement pitch, in an isolation pattern 1 μm or more away from an adjacent pattern, a diffraction angle becomes greater, and deformation of a cross-sectional shape is greater in a pattern formed by development, and the shape of a top portion in the resist pattern becomes a shape that is particularly easier to be shrunk by the electron beam. In other words, it becomes easier to measure the shrinkage by setting the pattern pitch effectually.

In FIGS. 1A and 1B, a region A surrounded with two white dotted lines indicates an isolated line pattern. Both views show a pattern having 0.15 μm of line width, and FIG. 1A shows a shape in the case of minus focus: −0.5 μm and FIG. 1B shows a shape in the case of plus focus: +0.4 μm. Herein, on the basis of a situation where a focal position (a focal plane) of the exposure apparatus is on the upper surface of the resist pattern, the minus focus is a value in the case where the focal plane is located on a side far from the substrate and the plus focus is a value in the case that the focal plane is located on a side near to the substrate.

In order to detect an edge (a white dotted line on the views) of the resist pattern, an edge detection technique, for example, a threshold method can be used. The threshold method is a method where a maximum value and a minimum value of signal strength in the vicinity of the edge are obtained with a secondary electronic signal detection of an SEM image, and a threshold is set in between the values, and the edge is defined from a position of an intersection point between the threshold and the secondary electronic signal. By such edge detection, the dimension of the isolated line pattern can be measured.

The shrinkage is defined by a plurality of pattern width dimension measurements. The pattern width dimension measurement is repeated n-times at the same point on the isolated line pattern. In this case, the shrinkage can be defined as a value by subtracting the pattern width measured for the n-th time from the pattern width measured for the 1st time. The definition of the shrinkage for each of a plurality of focus values, which are different from each other, enables the obtainment of dependency of the shrinkage with regard to the focus value. The focus values are changed in the exposure apparatus, and after exposing with a focus value and developing, a pattern width dimension of the developed resist pattern is measured n-times. The pattern width dimension for each focus value is measured n-times, and shrinkage for each focus value is calculated, respectively.

<Relationship between Shrinkage of Resist Pattern and Set Focus Value>

Figure 2:
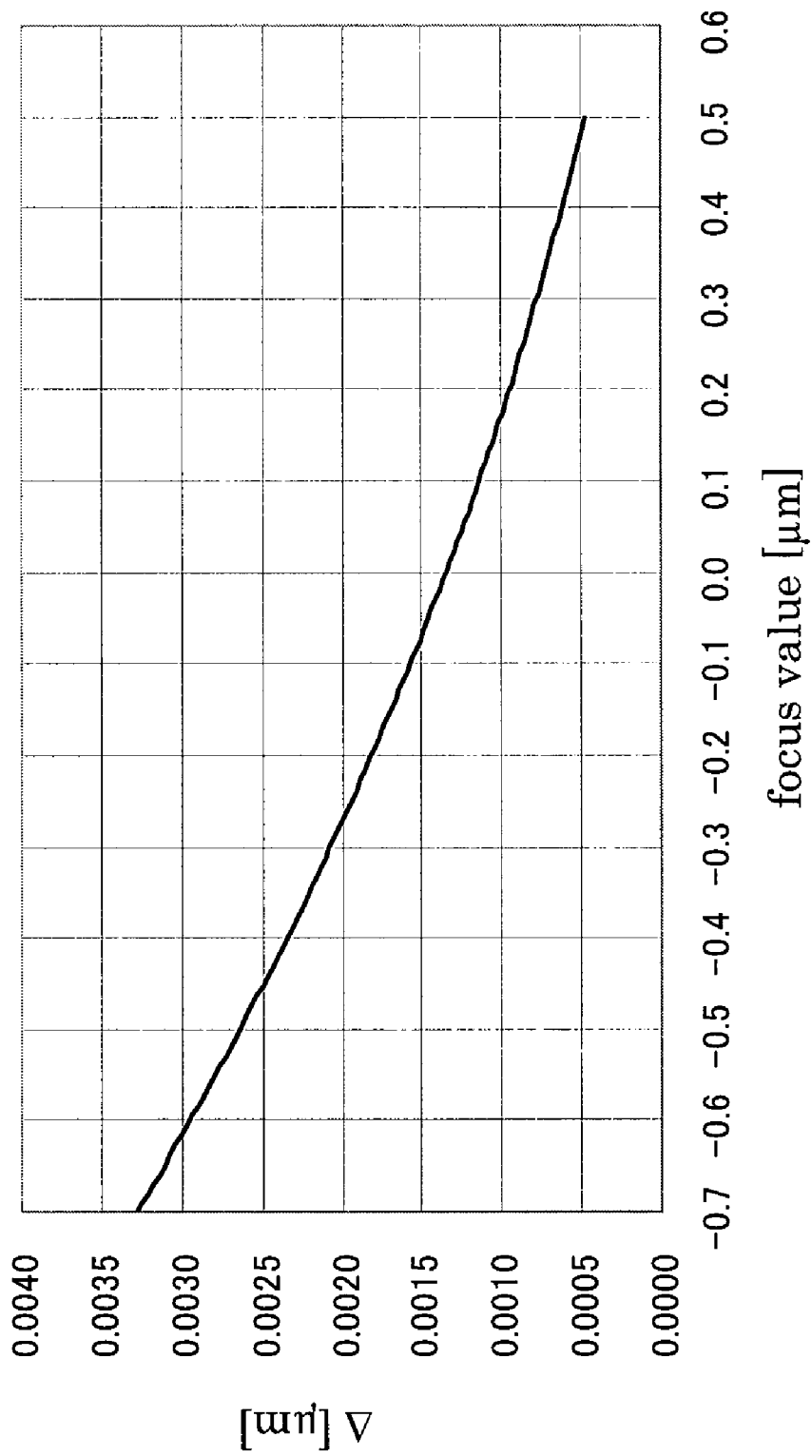
FIG. 2 is a graph showing focal dependency of shrinkage in one embodiment relating to the present invention.

FIG. 2 is a graph showing an example of dependency of the shrinkage measured for the isolation line resist pattern shown in FIGS. 1A and 1B with regard to a set focus value set on an exposure apparatus (hereafter, referred to as "focal dependency"). FIG. 2 shows values for measuring the bottom dimension of the line pattern, and the horizontal axis indicates the focus value and the vertical axis indicates the shrinkage A. As shown in FIG. 2, the shrinkage of the resist pattern width apparently depends upon the focus value, and the inventors of the present application have discovered such dependency. As the focus value shifts from the minus side to the plus side, the shrinkage tends to become smaller. When the focus value is shifted to the plus side, the focal position (focal plane) of the exposure apparatus moves toward the direction apart from the substrate, and when the focus value is shifted to the minus side, the focal plane moves toward the direction approaching the substrate. The focus value is a parameter to be set on the exposure apparatus in order to control a distance of the focal position of the exposure apparatus.

The focal dependency (FIG. 2) of the shrinkage of a resist pattern (herein, an isolated line pattern) for a focal shift measurement is acquired for each exposure apparatus, each semiconductor integrated circuit device and each photomask pattern layer. In order to acquire the focal dependency shown in FIG. 2, a process is specifically as follows: At first, a resist film formed on a semiconductor substrate is exposed with a focus value, which is different per shot, using a mask including a pattern for focal shift measurement. Then, the dimensions of the resist pattern corresponding to each exposure, which has been obtained by developing the exposed resist film, are measured n-times by scanning the electron beam within a chamber of a length measuring apparatus (CD-SEM), and the shrinkage Δ is calculated. With this step, a correspondence relationship between the focus value of the exposure apparatus and the shrinkage A of the resist pattern formed on the substrates by the exposure with the focus value is obtained. A curve showing the dependency of the shrinkage Δ with regard to the set focus value as shown in FIG. 2 can be prepared from data of the correspondence relationship.

Figure 3:
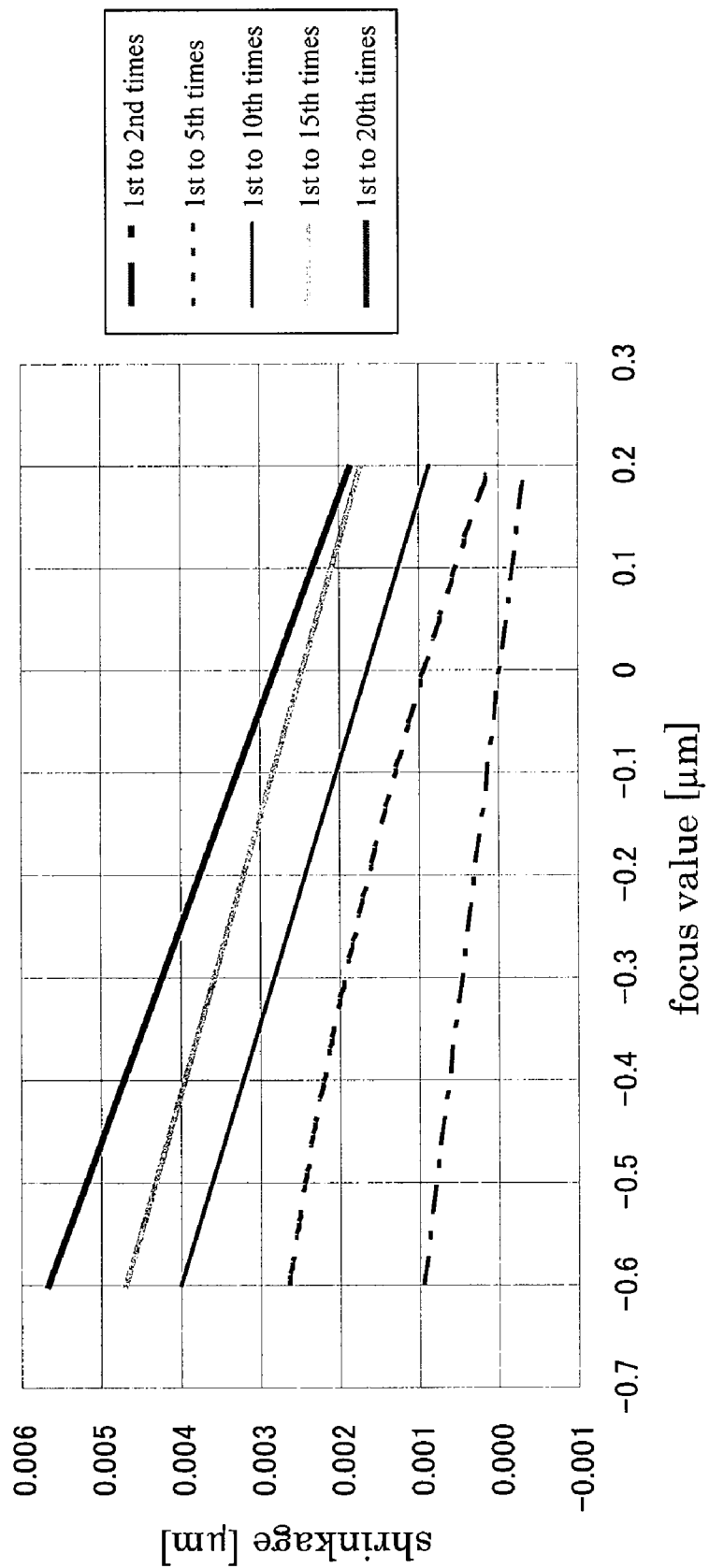
FIG. 3 is a graph showing a change in the focal dependency by the number of electron beam irradiation times in one embodiment relating the present invention.

FIG. 3 is a graph showing each focal dependency of the shrinkage when the number of electron beam irradiation times is differentiated. In FIG. 3, the horizontal axis indicates the focus value, and the vertical axis indicates the shrinkage of the isolation line resist pattern. The number of the most suitable measuring times can be determined by acquiring data of the focal dependency of the shrinkage with regard to the plurality of different number of electron beam irradiating times. The pattern dimension is measured by scanning an electron beam at the same point of the same resist pattern, and the shrinkage is calculated by subtracting the dimension measurement result for the k-th time from the dimension measurement result for the 1st time. The dimensions of the resist pattern formed using each set focus value set on the exposure apparatus are measured k-times, and an approximate line indicating a relationship according to the calculated shrinkage and the focus value is acquired. When the number of times to irradiate the electron beam to the resist pattern is increased, the resist pattern hardly shrinks after a certain number of times. At this time, the tilt of approximate line is no longer changed between the measurement of the k-th time and the (k-1)-th time. In other words, when the tilt of the approximate line is no longer changed, it means that the shrinkage is no longer changed with the electron beams thereafter. Also, the maximum value of shrinkage is obtained at this time, and the measurement sensitivity becomes the highest. Therefore, the (k-1)-times of measurement is the most suitable number of measuring times, and an automatic length measurement for the resist pattern to calculate the shrinkage is a measurement with n=(k-1) times and the number of times can be determined.

If (k-1) times of the electron beam irradiation, which is the minimum number of times to saturate the tilt, are set to the number of automatic length measuring times, a time for the shrinkage calculation can be shortened. Since the shrinkage of the pattern dimension varies according to a resist film, it is necessary to acquire basic data of the focal dependency of the shrinkage as shown in FIG. 2 per type of resist or per film thickness, and the measurement time of the pattern dimension becomes very long. Therefore, it is very advantageous to determine the number of measurements so as to hold the measurement to the required minimum times as mentioned above.

<Set Focus Value Dependency of Shrinkage>

Figure 4B:
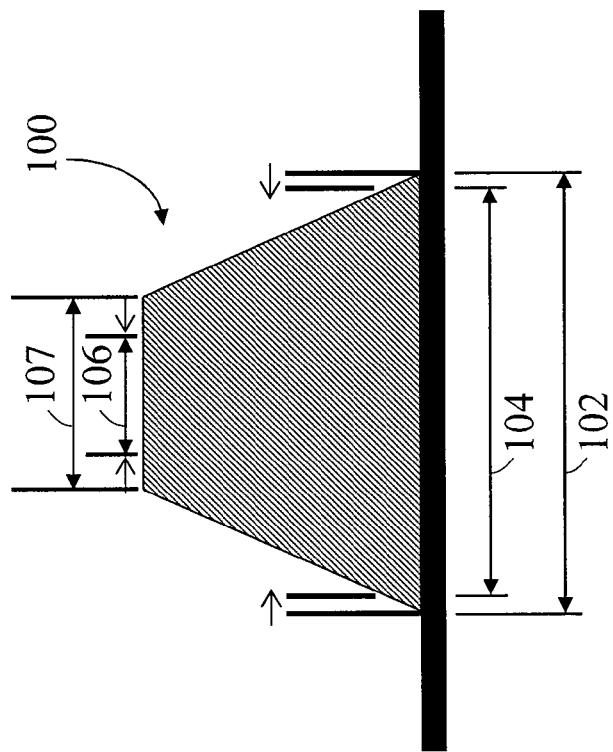
FIGS. 4A and 4B are schematic shrinkage views by a measurement of a resist pattern in one embodiment relating to the present invention.
Figure 4A:
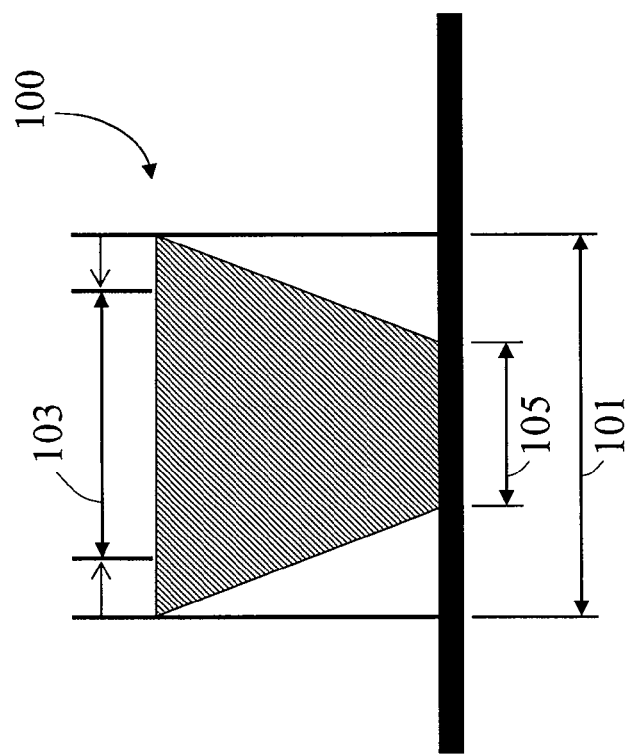

FIGS. 4A and 4B are drawings for explaining that the cross-sectional shape of an exposed and developed resist film pattern is changed according to a value of the set focus value set on an exposure apparatus. FIG. 4A shows a cross-sectional shape of the resist pattern at the minus focus side, and FIG. 4B shows a cross-sectional shape of the resist pattern at the plus focus side. It is assumed that the reason why the focal dependency is recognized as shown in FIG. 2 is as follows: In other words, the cross-sectional shape of the resist film developed is changed according to the set focus value, and angles of corners at edges of the top portion and the bottom portion of the resist pattern are changed, and then, an amount of the resist material forming the corner portion is also changed. Therefore, the degree of the deformation varies between the case using more resist material and less resist material for the corner portion even if the same intensity of the electron beam is irradiated; consequently, a difference in shrinkage is generated according to the set focus value.

As shown in FIG. 4A, the shape of the resist pattern at the minus focus side becomes a shape where the dimension of the bottom portion is smaller than that of the top portion (inverse tapered shape). When an electron beam is irradiated to this resist pattern and length is measured by scanning, the top portion of the resist shape shall shrink. FIG. 1A is an SEM pattern image at the case of the minus focus, and displays the visinity of the top portion. When the dimension of the resist pattern shown in FIG. 4A is measured using the threshold method, it results in measuring the dimension 101 of the top portion for the 1st time. Then, if the measurement of the length is repeated, the top portion of the resist pattern shape shown in FIG. 4A shrinks by the electron beam irradiation. The pattern width of the top portion is changed from the dimension 101 to the dimension 103, and it causes a change in the measured values, as well. Since the more a focal position is shifted toward the minus focus side, the wider the width of the top portion becomes and the smaller the width of the bottom portion becomes and the greater a ratio of the top dimension to the bottom dimension becomes, an angle of the corner portion of the top portion becomes steep and the shrinkage becomes greater, as well. However, when the ratio of the top dimension 101 to the bottom dimension 105 becomes excessively great, the resist pattern may fall.

In the meantime, as shown in FIG. 4B, the resist pattern shape at the plus focus side becomes a shape where the dimension of the bottom portion is greater than that of the top portion (forward tapered shape). FIG. 1B is an SEM image in this case, and because the resist pattern shape is a forward tapered shape, the inclines are shown. When an electron beam is irradiated and the resist pattern is measured using the threshold method, the dimension 102 of the bottom portion is measured. The bottom portion has excellent adhesion with the substrate, and the shrinkage by the electron beam irradiation is small. In the case of the plus focus, whereas the width of the top portion changes greatly from the dimension 106 to the dimension 107, the bottom portion slightly shrinks from the dimension 102 to the dimension 104. Qualitatively, the focal dependency of the shrinkage of the resist pattern dimension can be understood as described above.

<Calculation of Focal Shift Length>

A curve showing the set focus value dependency of the shrinkage A can be prepared as described above. In a state where the best focus value in the photolithography process corresponding to this curve is determined, a focal shift length of resist patterns (such as an isolated line pattern for focal shift measurement or integrated circuit element pattern and the like) formed on an actual semiconductor substrate can be calculated as follows: At first, an exposure to be a subject for the focal shift measurement is implemented to a semiconductor substrate formed with a resist film using the same exposure apparatus, resist material and length measurement pattern corresponding to the prepared curved, the exposure apparatus being set a predetermined focus value. The dimension of a resist pattern for focus measurement (hereafter, referred to as a measurement subject resist pattern) formed by the exposure is scanned with an electron beam, and shrinkage is calculated by measuring n-times, which is the same number of times when the set focus value dependency curve of the shrinkage $\Delta$ is prepared. Subsequently, based upon the pre-obtained focal dependency curve of the shrinkage, a focus value corresponding to the measured and calculated shrinkage is obtained.

When the calculated focus value is matched with the best focus value in the pre-obtained focal dependency of the shrinkage, it is recognized as the focal shift not occurring in the exposure of the focal shift measurement subject. Further, when the obtained focus value is different from the best focus value in the pre-obtained focal dependency of the shrinkage, it is recognized that the focal shift has occurred in the exposure of the focal shift measurement subject. For example, if the focus value corresponding to the measured and calculated shrinkage in the measurement subject resist pattern is $-0.2$ $\mu m$, it can be determined that the exposure forming the resist pattern is the best focus. Further, if the focus value corresponding to the measured and calculated shrinkage is a different value from $-0.2$ $\mu m$, such as $0.0$ $\mu m$ or $-0.3$ $\mu m$, in the measurement subject resist pattern, it can be determined that a focal shift has occurred in the exposure forming the resist pattern.

The best focus has been described above, and this best focus can be obtained as follows: In other words, the focus value set on the exposure apparatus is fluctuated from the minus focus to the plus focus; a top dimension or a bottom dimension of the resist line pattern corresponding to each focus value is measured; and a relationship is obtained by plotting the set focus values of the exposure apparatus in the horizontal axis and the measured dimensions of the resist pattern in the vertical axis. This relation becomes a quadratic curve in general, and a vertical axis coordinate value B, which is a design target dimension fitted as an element composed of a desired semiconductor integrated circuit, is regarded as a center and an average value of two focus values corresponding to the vertical axis coordinates of $B \pm 10\%$ on the quadratic curve as the best focus. Because such best focus value subtly varies even with an exposure apparatus with the same structure and the same model, the best focus value shall be obtained for each exposure apparatus.

In the method of this embodiment, as shown in FIG. 2, the focal dependency within the focus margin (DOF: depth of focus) range of the lithography can be acquired by measuring only an isolated line pattern with the shrink. In the conventional technique of detecting a focus fluctuation, such as a method described in the prior art document, it is necessary to measure both the top portion and the bottom portion in both the isolated space pattern and isolated line pattern formed by the same exposure. Further, an alignment time to align an electron beam both in the isolated space pattern and the isolated line pattern becomes required for measuring dimensions, as well. In this method, since focal dependency for both the isolated space pattern and the isolated line pattern must be acquired and the focus fluctuation has to be detected for both dependencies, the working hour and man-hours are considerably more in comparison with the focal shift detection method according to this embodiment. In the meantime, the method of this embodiment has an advantage that the work volume is drastically decreased. Thus, according to this embodiment, a presence of focal shift in the exposure process to produce a semiconductor integrated circuit device can be easily detected.

<Dimension of Isolated Line Pattern>

Figure 5:
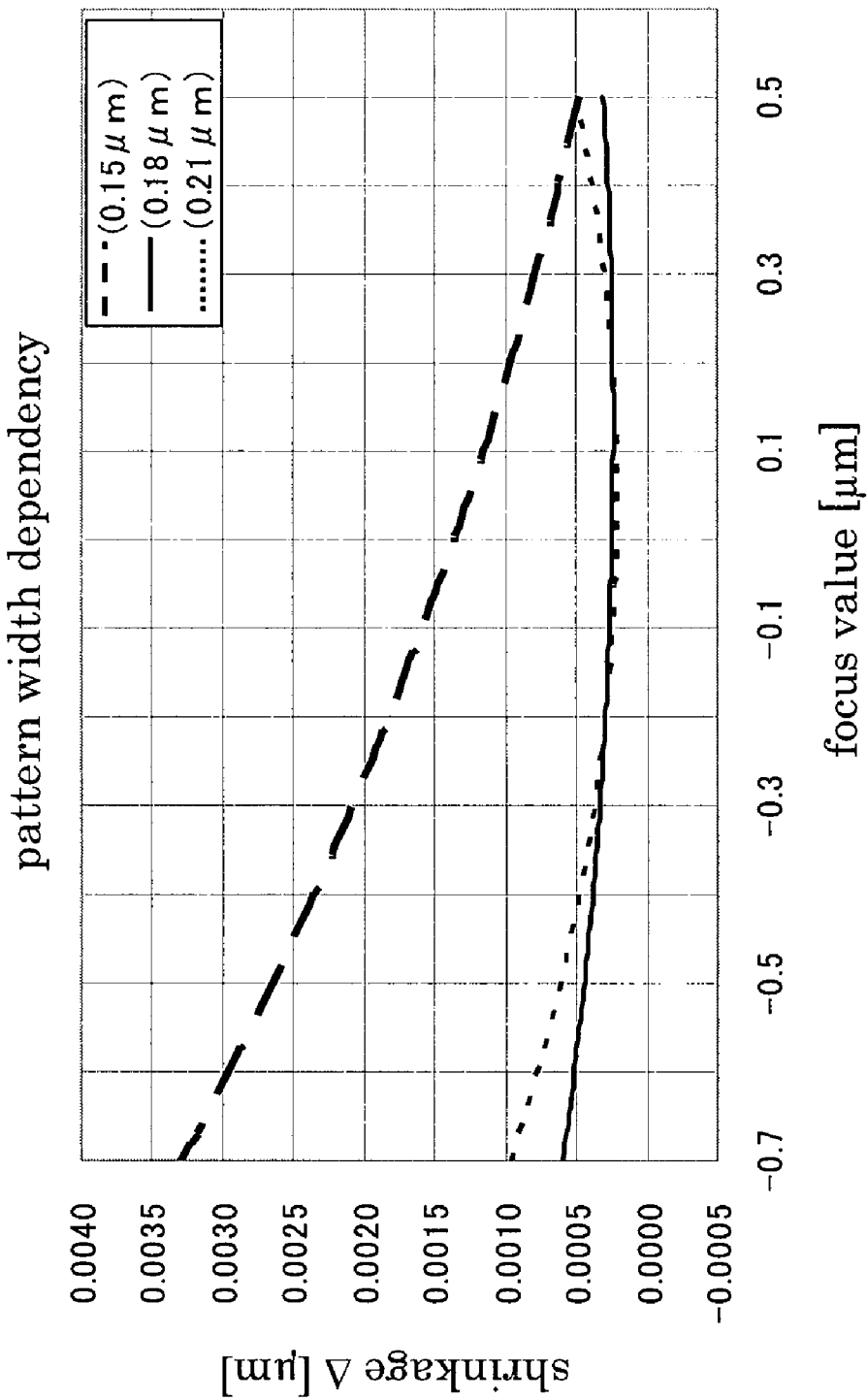
FIG. 5 is a graph showing a change of the focal dependency of the shrinkage with regard to the line width in one embodiment relating to the present invention.

FIG. 5 is a graph showing a set focus value dependency of the shrinkage of the isolated line pattern using the line pattern width as a parameter. The line pattern having each width is formed with the same resist material. According to FIG. 5, it is understood that the fluctuation of the shrinkage varies according to a difference in the resist pattern width. The fluctuation of the shrinkage against the focus value is small in the case of 0.21 µm or 0.18 µm, whereas that of the shrinkage with the minimum pattern width: 0.15 µm, which can be resolved with the exposure and the resist to be used, becomes obvious. According to this result, it is understood that the pattern width in the smallest lithography margin range in a usable condition range in the production of an actual semiconductor integrated circuit has the greatest fluctuation of the shrinkage with regard to the focal fluctuation.

FIGS. 6A and 6B are graphs showing the focus dependencies regarding the shrinkage of the resist pattern for each exposure apparatus. Although FIGS. 6A and 6B show the results of exposure using exposure apparatuses with the same model, both are difference. As shown in FIGS. 6A and 6B, the tilt of the curve indicating the focal dependency becomes consistent not depending upon the difference of the exposure apparatuses. It is ascertained that the shrinkage is equal when a quadratic curve approximation is conducted for each curve. In the meantime, the tilt of the focal dependency curve regarding the shrinkage depends upon the resist material.

Furthermore, in the above-mentioned embodiment, the line pattern having the forward tapered shape or the inverse tapered shape is used as a resist pattern for a focus measurement. However, for the resist pattern, not only with the line pattern but also with line, space, dot and hole and other patterns, the focus fluctuation can be detected as long as the shrinkage has the focal dependency.

Second Embodiment

Hereafter, another embodiment regarding an exposure development system using the focus measurement method and the focal shift length calculation method described in the first embodiment, and a photolithography process including a use of this exposure system will be described.

Figure 7:
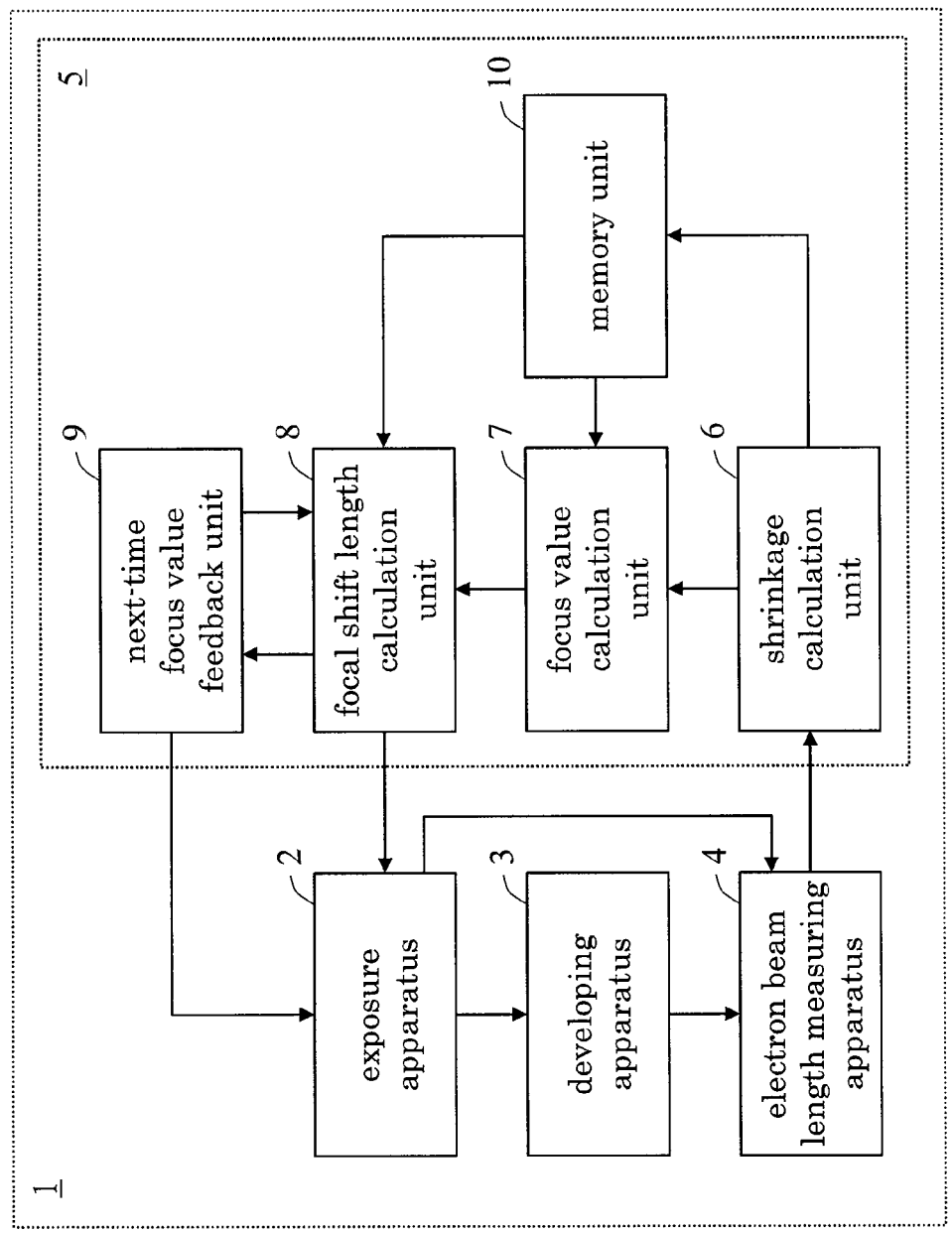
FIG. 7 is a block diagram showing an exposure system in one embodiment relating to the present invention.

FIG. 7 is block diagram schematically showing an exposure system in this embodiment. An exposure system 1 performs exposure and development including the focus measurement and the focal shift length calculation process in the lithography process. As shown in FIG. 7, the exposure system 1 is composed of an exposure apparatus 2, a developing apparatus 3, an electron beam length measuring apparatus 4 and a focus measuring apparatus 5. The focus measuring apparatus 5 is composed of a shrinkage calculation unit 6, a focus value calculation unit 7, a focal shift length calculation unit 8, a next-time focus value feedback unit 9 and a memory unit 10. The memory unit 10 stores a database indicating the focal dependency of the shrinkage and data of best focus values.

In a photolithography process with one particular lot, the exposure apparatus 2 specified in advance performs an ordinary exposure to a precursor wafer for confirming exposure conditions of the lot using predetermined exposure conditions. Next, after an exposed resist is developed by the developing apparatus 3, a dimension is measured a plurality of times by the electron beam length measuring apparatus 4 at the same point of a developed pattern for a focus measurement or focal shift calculation. On that occasion, the length measuring apparatus 4 outputs length measurement result data to the shrinkage calculation unit 6. The shrinkage calculation unit 6 calculates shrinkage by electron beam irradiation based on multiple-time length measurement result data, and inputs calculated data to the focus value calculation unit 7. The focus value calculation unit 7 refers to a focal dependency database stored in the memory unit 10, and obtains a focus value corresponding to the shrinkage supplied from the shrinkage calculation unit 6. The focal shift length calculation unit 8 compares the focus value obtained from the focus value calculation unit 7 with a best focus value read from the memory unit 10, and calculates a focal shift length from a difference of both values. The next-time focus value feedback unit 9 determines acceptability of the exposure process based upon the focal shift length obtained from the focal shift length calculation unit 8 and feeds back the focal shift length to the exposure apparatus 2. Because of this feedback, it becomes possible to improve the lot quality.

Figure 8:
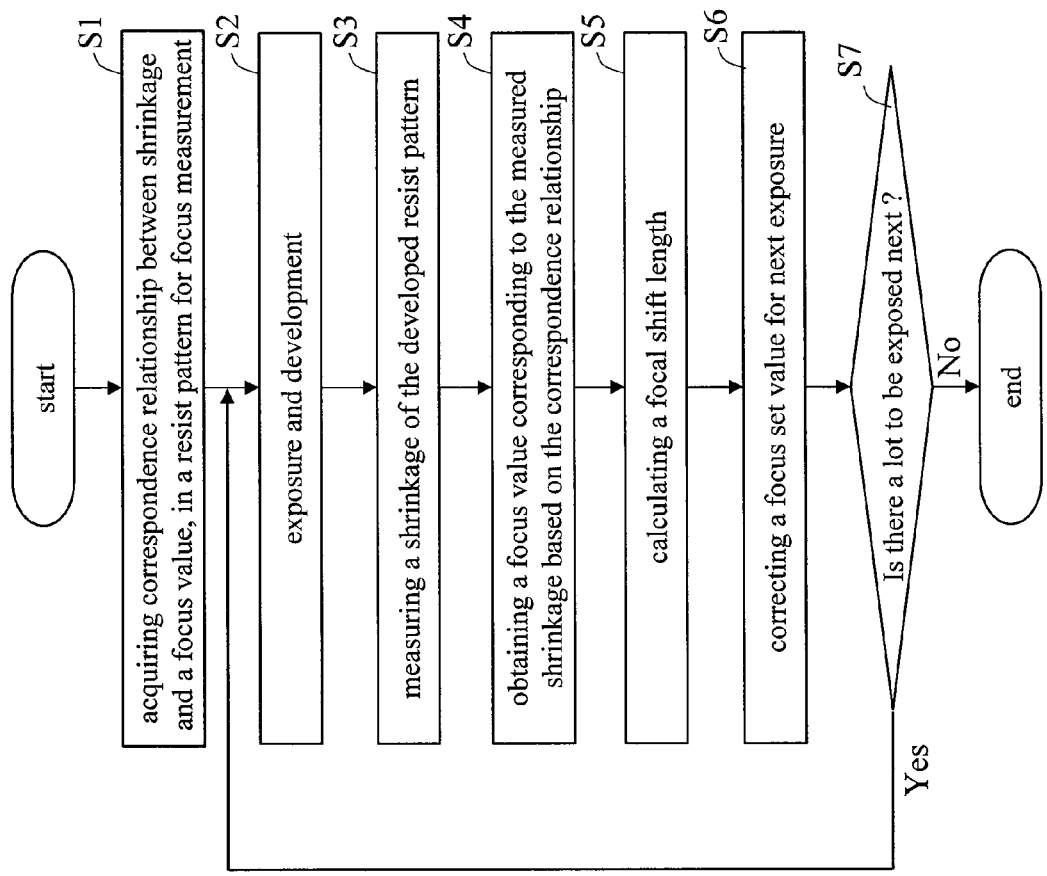
FIG. 8 is a flowchart showing a processing in a lithography process in one embodiment relating to the present invention.
Figure 9:
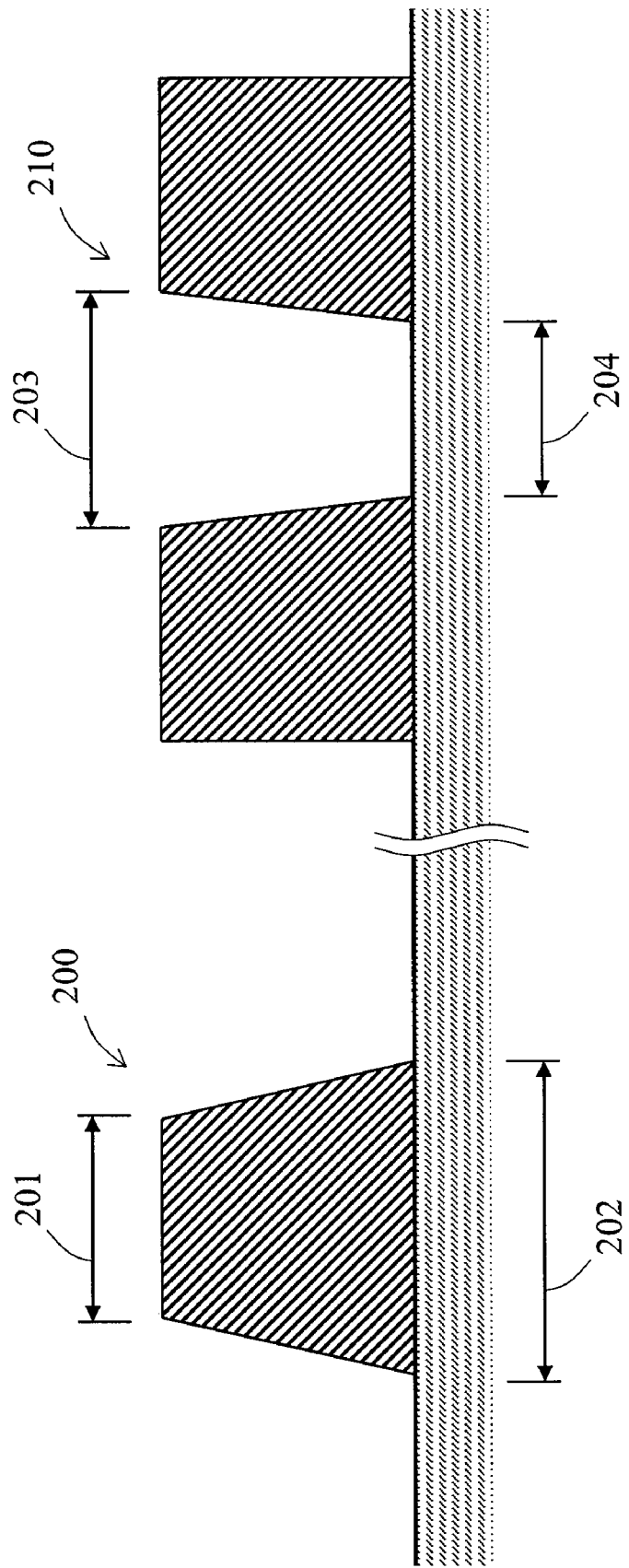
FIG. 9 is a cross sectional view of a resist pattern to be used for a focus measurement.
Figure 10B:
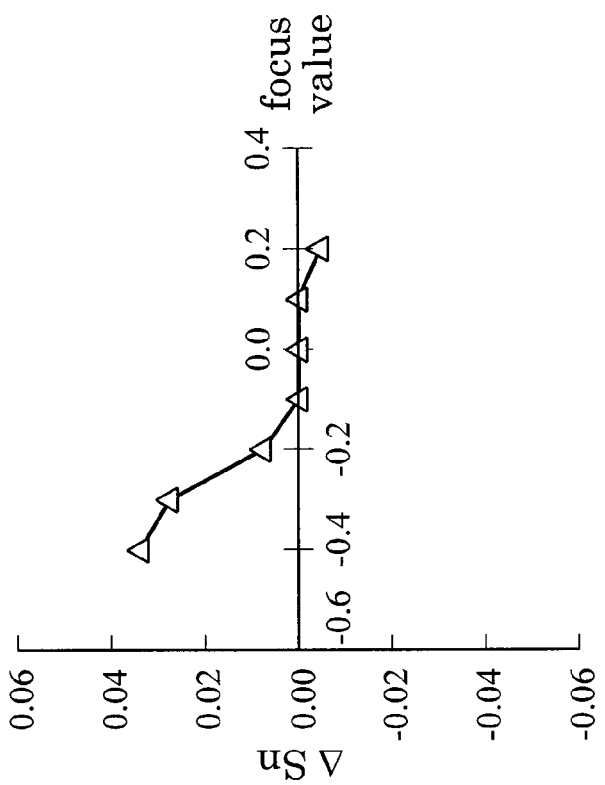
FIGS. 10A and 10B are graphs showing focal dependency of edge inclination amount with a conventional focus measurement method.
Figure 10A:
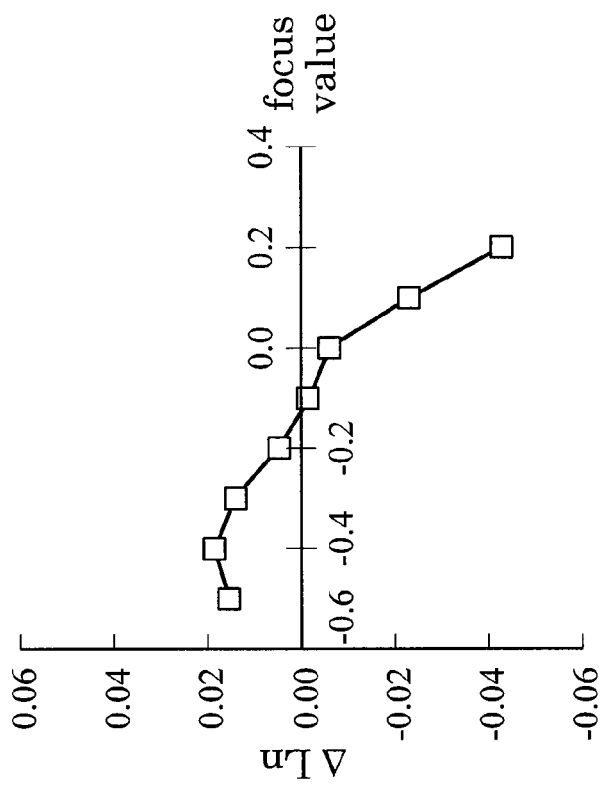
Figure 11:
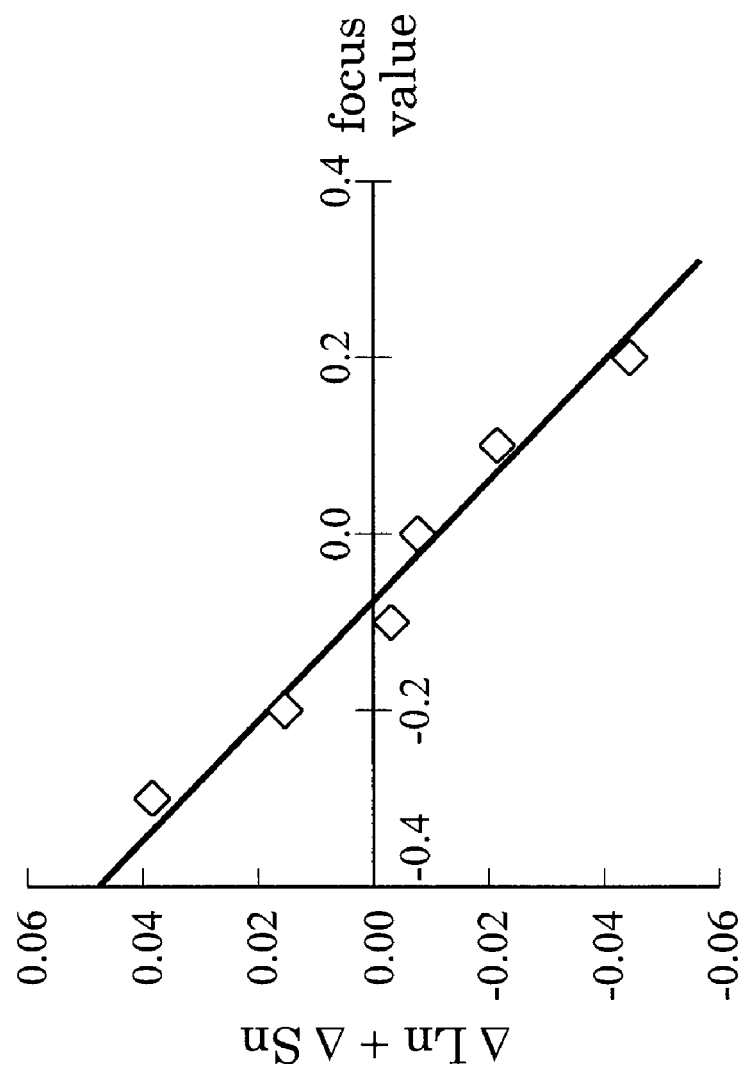
FIG. 11 shows the focal dependency of a shift index with a conventional focus measurement method.

FIG. 8 is a flowchart for explaining a photolithography process using the above-mentioned exposure system. At first, a correspondence relationship, in the resist pattern for focus measurement, between the shrinkage A and the set focus value is acquired (S1), and the correspondence relationship is pre-stored in the memory unit 10 of the exposure system 1. Next, before an exposure to form an actual semiconductor integrated circuit pattern, a subject wafer for detecting a focus fluctuation is exposed and developed (S2). The shrinkage of a particular pattern after the development is measured in line or off line (S3). A focus value corresponding to the measured shrinkage is obtained based upon the correspondence relationship pre-stored in the memory unit 10 (S4). A focal shift length from the best focus value is calculated using the obtained focus value (S5). Next, the set focus value of the exposure apparatus 2 is corrected only by he focal shift length or by a value corresponding to the focal shift length so that the most suitable focus value for the next exposure is set on the exposure apparatus 2 (S6). Then, all wafers (semiconductor substrates) included in one lot where the actual semiconductor integrated circuit pattern should be formed are exposed. The exposure of all wafers in one lot is completed, and whether or not there is a lot to be exposed next is determined (S7). If there is no lot to be exposed next, the processing is ended, and if there is another lot, the step S2 and thereafter will be repeated.

Thus, the feedback of the focus value to the exposure apparatus enables the improvement of stability of the focus value at the time of exposure. Furthermore, it is desirable that this feedback is conducted by a unit of processing lot in one exposure apparatus or by a unit of processing lot in a particular process performed in one exposure apparatus.

As described above, with the focus measurement method and the focal shift length calculation method in this embodiment, even a resist material including a chemically-amplified resist to be used in the excimer lithography, such as KrF or ArF, which is easily deformed and shrunk due to the electron beam irradiation used at the time of the pattern dimension measurement, and where the accurate pattern dimension measurement, i.e., the exposure focus value measurement and the focal shift length calculation cannot be easily conducted, can be accurately measured and calculated. Then, since a highly-accurate fine pattern can be formed, it is effective particularly for finer 65 nm and 45 nm processes compared to the 90-nm process node, as well.

The present invention has an effect to enable the easy detection of a focal shift length under a situation to form a fine resist pattern where a focal dependency of shrinkage becomes remarkable, and is useful as a focus measurement method, a manufacturing method for a semiconductor device and an exposure system.

What is claimed is:

1. A focus measurement method, comprising the steps of:
preparing a correspondence relationship between a focus value set on an exposure apparatus and a shrinkage of a resist pattern obtained by measuring a dimension of the resist pattern a plurality of times, the resist pattern being formed on a substrate using the exposure apparatus with the focus value;
measuring the dimension of the resist pattern formed on a substrate to be a subject for a focus measurement by exposure using the exposure apparatus with a set focus value the plurality of times;
obtaining the shrinkage of the resist pattern formed by exposure with the set focus value according to the measured result; and
obtaining a focus value corresponding to the obtained shrinkage based upon the correspondence relationship.

2. The focus measurement method according to claim 1, wherein the dimension of the resist pattern is measured a plurality of times by irradiating an electron beam to the same portion of the resist pattern.

3. The focus measurement method according to claim 2, wherein the step of obtaining the shrinkage of the resist pattern includes a step of calculating the shrinkage of the resist pattern by the electron beam irradiation from the dimension measured the plurality of times.

4. The focus measurement method of claim 3, wherein the shrinkage of the resist pattern is calculated by subtracting a value of a final measurement of the dimension from a value of an initial measurement of the dimension.

5. The focus measurement method according to claim 2, further comprising a step of pre-determining a number of times for measuring the resist pattern based upon a number of times to saturate the shrinkage of the resist pattern caused by the electron beam irradiation.

6. The focus measurement method according to claim 3, further comprising a step of pre-determining a number of times for measuring the resist pattern based upon a number of times to saturate the shrinkage of the resist pattern caused by the electron beam irradiation.

7. The focus measurement method according to claim 4, further comprising a step of pre-determining a number of times for measuring the resist pattern based upon a number of times to saturate the shrinkage of the resist pattern caused by the electron beam irradiation.

8. The focus measurement method according to claim 1, wherein the resist pattern is made of a chemically-amplification resist material.

9. The focus measurement method according to claim 2, wherein the resist pattern is made of a chemically-amplification resist material.

10. The focus measurement method according to claim 1, wherein the resist pattern is an isolated line pattern.

11. The focus measurement method according to claim 2, wherein the resist pattern is an isolated line pattern.

12. The focus measurement method according to claim 8, wherein the resist pattern is an isolated line pattern.

13. The focus measurement method according to claim 10, wherein the line pattern width is 0.15 μm or less.

14. The focus measurement method according to claim 11, wherein the line pattern width is 0.15 μm or less.

15. The focus measurement method according to claim 12, wherein the line pattern width is 0.15 μm or less.

16. A method of manufacturing a semiconductor device, comprising:
preparing a correspondence relationship between a focus value set on an exposure apparatus and a shrinkage of a resist pattern obtained by measuring a dimension of the resist pattern a plurality of times, the resist pattern being formed on a substrate using the exposure apparatus with the focus value;
measuring the dimension of the resist pattern formed on a substrate to be a subject for a focus measurement by exposure using the exposure apparatus with a set focus value the plurality of times;
obtaining the shrinkage of the resist pattern formed by exposure with the set focus value according to the measured result;
obtaining a focus value corresponding to the obtained shrinkage based upon the correspondence relationship;
obtaining a focal shift length based upon the obtained focus value;
correcting the set focus value set on the exposure apparatus based upon the obtained focal shift length; and
exposing a substrate by the exposure apparatus on which the corrected set focus value is set.

17. The method for manufacturing a semiconductor device according to claim 16, wherein the corrected set focus value is used for a plurality of substrates contained in a same lot.

* * * * *